United States Patent
Nagata

(10) Patent No.: US 11,846,023 B2
(45) Date of Patent: Dec. 19, 2023

(54) INJECTOR AND SUBSTRATE PROCESSING APPARATUS USING THE SAME, AND SUBSTRATE PROCESSING METHOD

(71) Applicant: TOKYO ELECTRON LIMITED, Tokyo (JP)

(72) Inventor: Tomoyuki Nagata, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 382 days.

(21) Appl. No.: 16/587,979

(22) Filed: Sep. 30, 2019

(65) Prior Publication Data

US 2020/0102652 A1  Apr. 2, 2020

(30) Foreign Application Priority Data

Oct. 2, 2018  (JP) ................. 2018-187700

(51) Int. Cl.
   *C23C 16/455*  (2006.01)
   *C23C 16/458*  (2006.01)
   *H01L 21/687*  (2006.01)

(52) U.S. Cl.
   CPC .... *C23C 16/45578* (2013.01); *C23C 16/4584* (2013.01); *H01L 21/68735* (2013.01)

(58) Field of Classification Search
   CPC .......... C23C 16/45578; C23C 16/4583; H01L 21/67303; H01L 21/67306; H01L 21/67309; F27B 17/0025; F27B 1/00; C30B 25/10; C30B 25/12
   See application file for complete search history.

(56) References Cited

U.S. PATENT DOCUMENTS

| | | | | |
|---|---|---|---|---|
| 4,062,318 A | * | 12/1977 | Ban | C23C 16/45506 118/725 |
| 6,121,579 A | * | 9/2000 | Aoki | H01L 21/67115 219/390 |
| 2007/0034158 A1 | * | 2/2007 | Nakaiso | H01L 21/67109 118/725 |
| 2008/0035055 A1 | * | 2/2008 | Dip | H01L 21/67109 118/725 |

(Continued)

FOREIGN PATENT DOCUMENTS

JP  2010-225887 A  10/2010
JP  2011029441 A  2/2011

(Continued)

OTHER PUBLICATIONS

English translation of JP 2013-89818 (Year: 2013).*

*Primary Examiner* — Aiden Lee
(74) *Attorney, Agent, or Firm* — Nath, Goldberg & Meyer; Jerald L. Meyer; Tanya E. Harkins

(57) ABSTRACT

There is provided an injector that extends in a longitudinal direction, including: a gas introduction part having a circular or a regular polygonal shape in a cross section perpendicular to the longitudinal direction and having no discharge holes; and a gas supply part having a protruded portion in one direction in the cross section perpendicular to the longitudinal direction, and having a plurality of discharge holes formed in a leading end of the protruded portion along the longitudinal direction, wherein a first end of the gas supply part in the longitudinal direction is connected to the gas introduction portion.

7 Claims, 8 Drawing Sheets

(56) References Cited

U.S. PATENT DOCUMENTS

| | | | |
|---|---|---|---|
| 2012/0167824 A1* | 7/2012 | Maeng | C23C 16/45572 118/724 |
| 2015/0275369 A1* | 10/2015 | Terada | C30B 31/16 118/715 |
| 2018/0135179 A1* | 5/2018 | Ikeuchi | C23C 16/46 |

FOREIGN PATENT DOCUMENTS

| | | | |
|---|---|---|---|
| JP | 2012-146939 A | | 8/2012 |
| JP | 2013089818 A | * | 5/2013 |
| JP | 2018056232 A | | 4/2018 |
| JP | 2018-81956 A | | 5/2018 |
| KR | 10-2018-0054447 A | | 5/2018 |

* cited by examiner

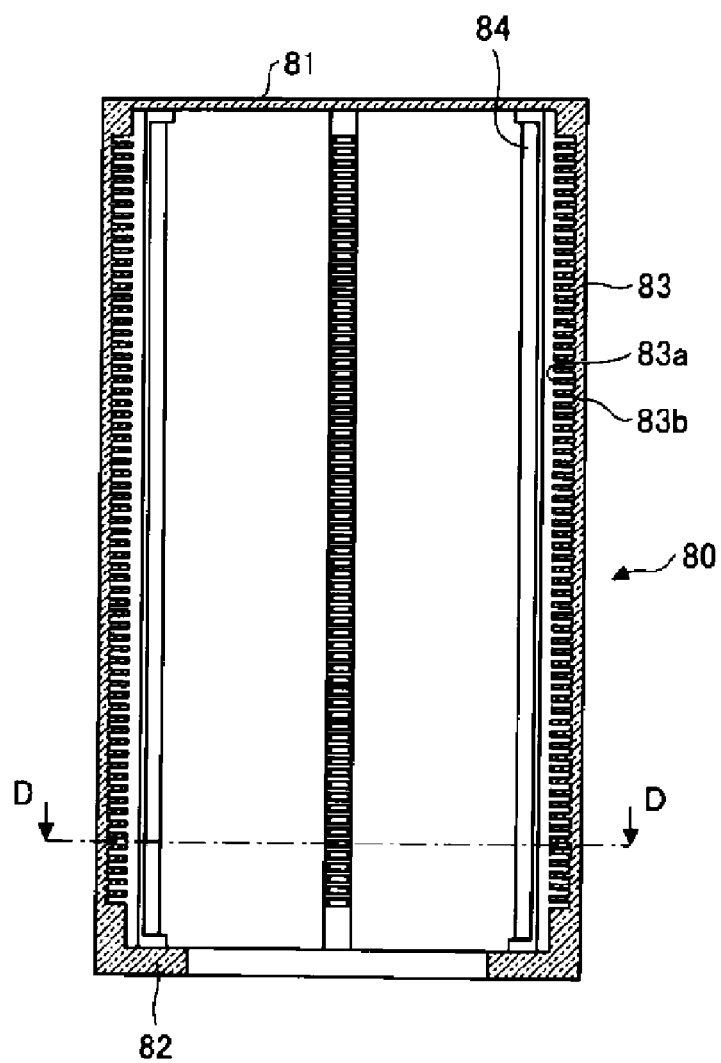

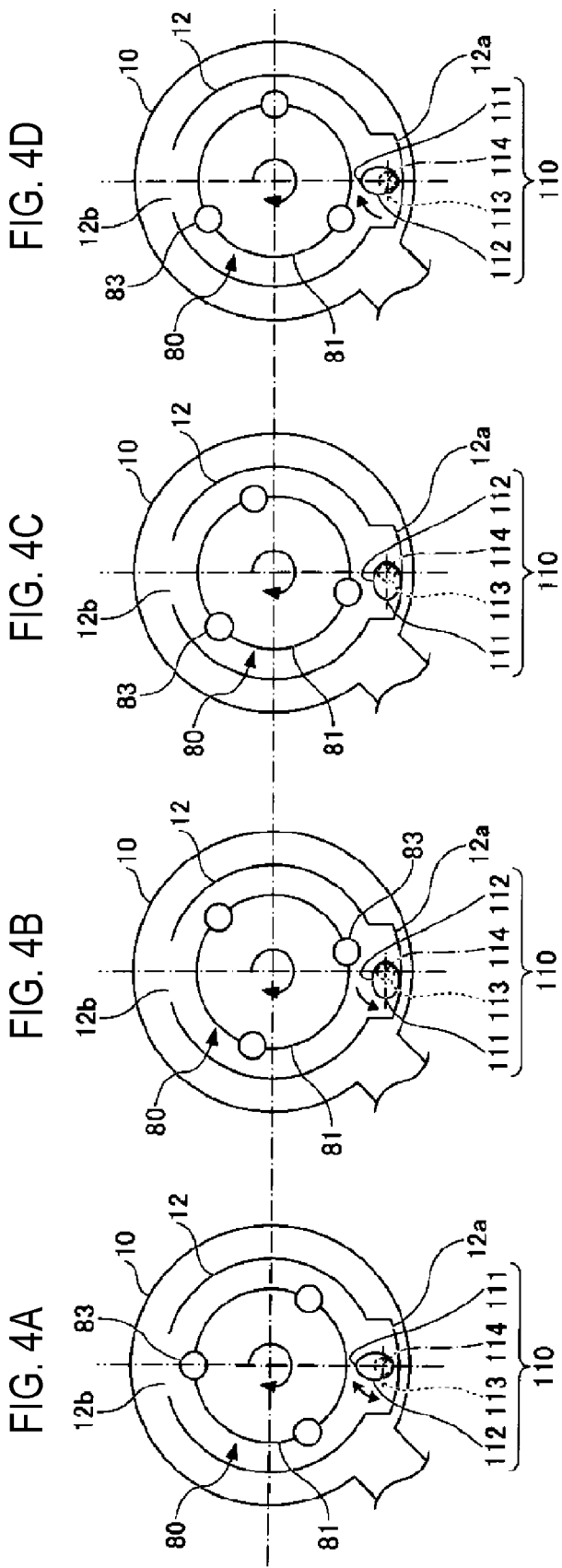

INJECTOR AND SUBSTRATE PROCESSING APPARATUS USING THE SAME, AND SUBSTRATE PROCESSING METHOD

CROSS-REFERENCE TO RELATED APPLICATION

This application is based upon and claims the benefit of priority from Japanese Patent Application No. 2018-187700, filed on Oct. 2, 2018, the entire contents of which are incorporated herein by reference.

TECHNICAL FIELD

The present disclosure relates to an injector and a substrate processing apparatus using the same, and a substrate processing method.

BACKGROUND

There has been known a gas introduction mechanism used to perform a predetermined process on a substrate using a predetermined gas inside a processing container. Such a gas introduction mechanism includes an injector supporting part that extends vertically along an inner wall surface of the processing container and has an insertion hole into which a tubular member can be inserted and externally fitted and supported, an injector that is inserted into the insertion hole and linearly extends entirely along the inner wall surface, and a rotation mechanism that is connected to a lower end portion of the injector and rotates the injector (see, e.g., Patent Document 1).

In addition, there has been known a substrate processing apparatus which includes a substrate holder for holding a plurality of substrates in a stacked state, a processing chamber in which the substrates held by the substrate holder are processed, a gas supply part that extends in the stacking direction of the substrates inside the processing chamber and supplies a processing gas to the substrates, an angle changing device that changes an angle of the gas supply part in a direction parallel to main surfaces of the substrates held by the substrate holder, a rotation device that rotates the substrate holder, and a controller that controls the operation of changing the angle of the gas supply part and the operation of rotating the substrate holder to be synchronized with each other (see, e.g., Patent Document 2).

PRIOR ART DOCUMENT

Patent Documents

Patent Document 1: Japanese laid-open publication No. 2018-56232
Patent Document 2: Japanese laid-open publication No. 2011-29441

SUMMARY

According to one embodiment of the present disclosure, there is provided an injector that extends in a longitudinal direction, including: a gas introduction part having a circular or a regular polygonal shape in a cross section perpendicular to the longitudinal direction and having no discharge holes; and a gas supply part having a protruded portion in one direction in the cross section perpendicular to the longitudinal direction, and having a plurality of discharge holes formed in a leading end of the protruded portion along the longitudinal direction, wherein a first end of the gas supply part in the longitudinal direction is connected to the gas introduction portion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 2A to 2C are views showing an example of a wafer boat of the substrate processing apparatus according to the embodiment.

FIGS. 4A to 4D are views for explaining the operation of the injector and the substrate processing apparatus according to the embodiment of the present disclosure.

DETAILED DESCRIPTION

Figure 1:
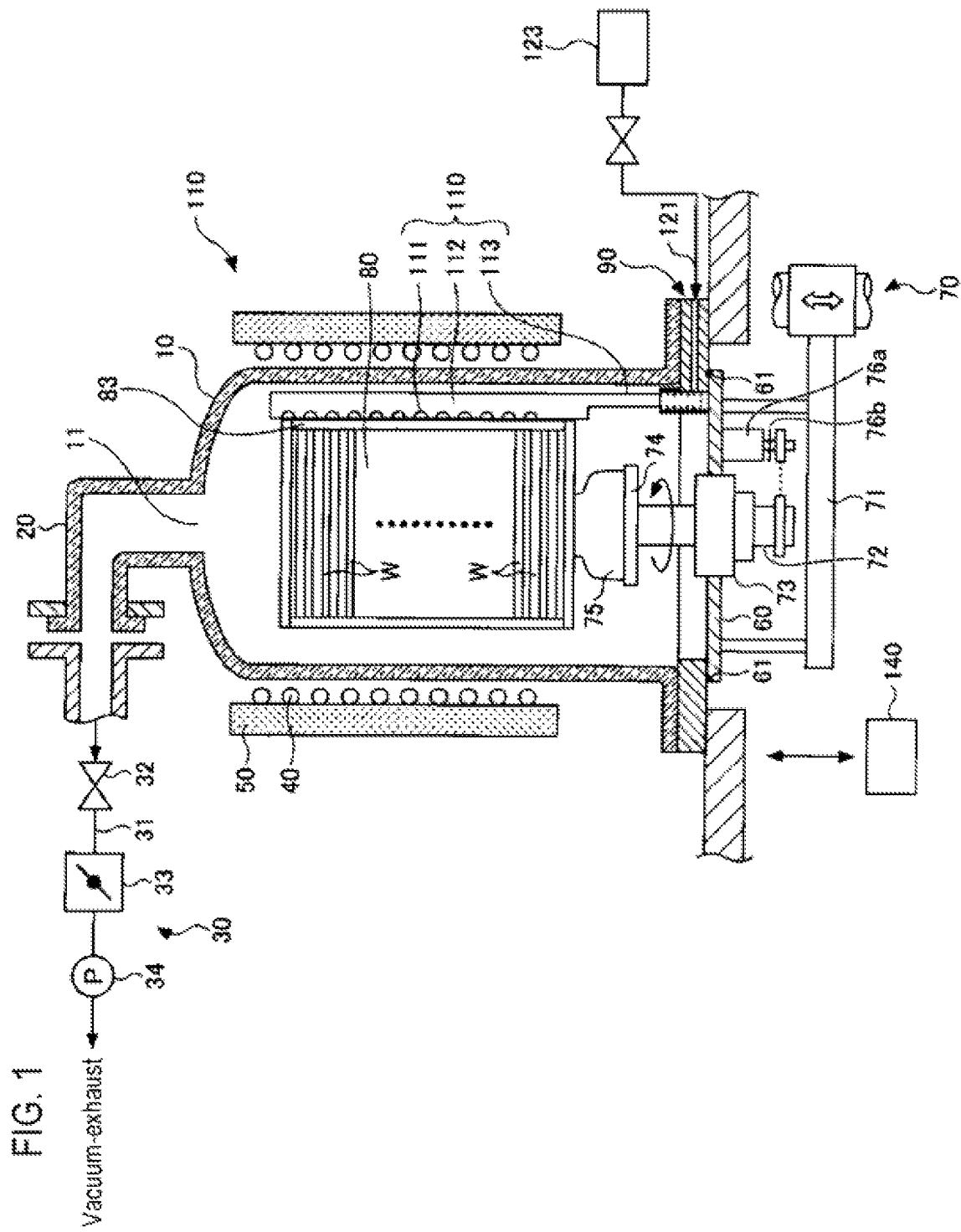
FIG. 1 is a schematic view of a substrate processing apparatus according to an embodiment.

Hereinafter, embodiments for carrying out the present disclosure will be described with reference to the drawings. Throughout the specification and the drawings, the same or similar parts and portions are denoted by the same reference numerals, and description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus]

A substrate processing apparatus according to an embodiment of the present disclosure will be described below. In an embodiment, a substrate processing apparatus that performs heat treatment on a substrate will be described as an example. However, a processing target and processing content are not particularly limited, but the present disclosure may be applied to other various substrate processing apparatuses that perform a substrate processing by supplying a gas into a processing container.

FIG. 1 is a schematic view of the substrate processing apparatus according to an embodiment. As shown in FIG. 1, the substrate processing apparatus includes a reaction tube 10 in which semiconductor wafers (hereinafter referred to as "wafers W") can be accommodated. The reaction tube 10 is a processing container for accommodating and processing the wafers W. The reaction tube 10 is made of quartz having high heat resistance and formed in a substantially cylindrical shape, and has an exhaust port 11 formed in its ceiling portion. The reaction tube 10 is provided to have a vertical shape extending in the vertical (up and down) direction. For example, when a diameter of the wafer W to be processed is 300 mm, a diameter of the reaction tube 10 may be set to fall within a range of about 350 to 450 mm.

A gas exhaust port 20 is connected to the exhaust port 11 formed in the ceiling portion of the reaction tube 10. The gas exhaust port 20 is formed of, for example, a quartz tube that extends from the exhaust port 11 and is bent in an L shape at a right angle with respect to the exhaust port 11.

A vacuum exhaust system 30 for exhausting an internal atmosphere of the reaction tube 10 is connected to the gas exhaust port 20. Specifically, the vacuum exhaust system 30 includes a metal gas exhaust pipe 31 made of, for example, stainless steel, which is connected to the gas exhaust port 20. Further, an opening/closing valve 32, a pressure regulating valve 33 such as a butterfly valve, and a vacuum pump 34 are sequentially installed in the gas exhaust pipe 31 so as to evacuate the interior of the reaction tube 10 while adjusting an internal pressure of the reaction tube 10. An inner diameter of the gas exhaust port 20 is set to be equal to that of the gas exhaust pipe 31.

A heater 40 is provided near a lateral portion of the reaction tube 10 so as to surround the reaction tube 10 so that the wafer W accommodated in the reaction tube 10 can be heated. The heater 40 is divided into, for example, a plurality of zones, and is configured by a plurality of heaters (not shown) whose heat generation amount can be controlled independently of one another from above downward in the vertical direction. Alternatively, the heater 40 may be configured by a single heater without being divided into the plurality of zones. A heat insulating member 50 is provided in the outer periphery of the heater 40 so as to ensure thermal stability.

A lower end portion of the reaction tube 10 is opened so that the wafer W can be loaded and unloaded through the opened lower end portion. The opening at the lower end portion of the reaction tube 10 is opened and closed by a lid 60.

A wafer boat 80 is provided above the lid 60. The wafer boat 80 is a substrate holder for holding the wafers W and is configured to hold the plurality of wafers W at vertical intervals in multiple stages. The number of wafers W held by the wafer boat 80 is not particularly limited, but may be, for example, 50 to 150.

Figure 2A:
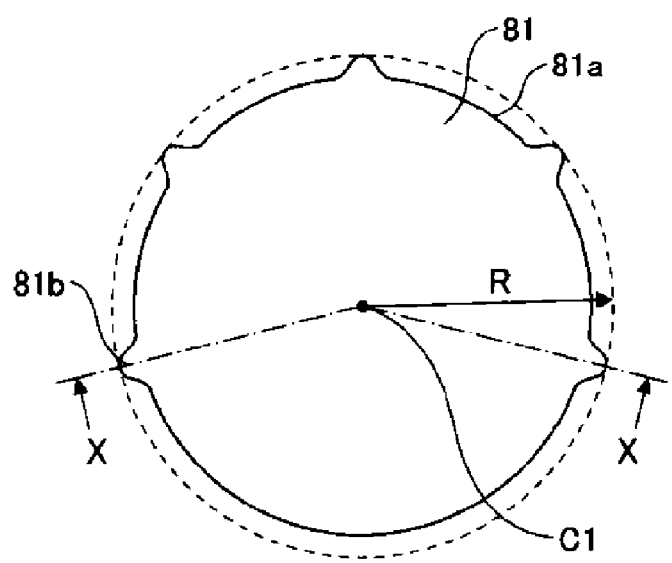
Figure 2C:
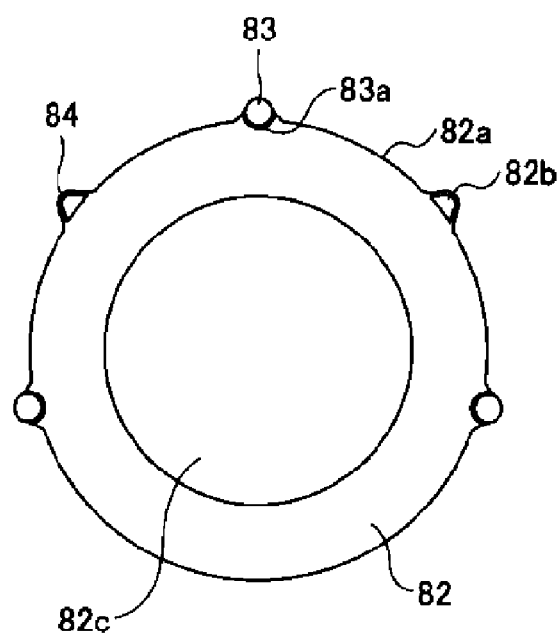

FIGS. 2A to 2C are views showing an example of the wafer boat 80 in the substrate processing apparatus according to the present embodiment. FIG. 2A is a top view of the wafer boat 80, FIG. 2B is an elevation view of the wafer boat 80, and FIG. 2C is a cross-sectional top view taken along line D-D in FIG. 2B.

As shown in FIGS. 2A to 2C, the wafer boat 80 includes a ceiling plate 81, a bottom plate 82, a substrate holding pillar 83 and an auxiliary pillar 84. Of these, the auxiliary pillar 84 is not essential but may be provided as necessary.

As shown in FIG. 2B, the ceiling plate 81 is disposed at the top of the wafer boat 80 and the bottom plate 82 is disposed at the bottom of the wafer boat 80. Both ends of each of the substrate holding pillar 83 and the auxiliary pillar 84 are connected and fixed to the ceiling plate 81 and the bottom plate 82, respectively. In FIG. 2B, the substrate holding pillar 83 and the auxiliary pillar 84 are interposed between the ceiling plate 81 and the bottom plate 82 and are provided so as to connect and support the ceiling plate 81 and the bottom plate 82.

The substrate holding pillar 83 is a means for holding substrates such as the wafers W in multiple stages, and has, for example, a plurality of hooks 83a formed in the vertical direction. A groove 83b is formed between the hooks 83a adjacent to each other. The wafers W can be held inside the grooves 83b (or on the hooks 83a) in a horizontal posture, respectively. In this manner, the substrate holding pillar 83 is configured to hold the wafers W inside the grooves 83b in multiple stages in a horizontal posture. In order to hold the wafers W, it is necessary to support the wafers W at least three or more points. Thus, at least three substrate holding pillars 83 are required. The wafer boat 80 for holding the wafers W is not limited to the configuration in which the grooves 83b are formed, but may be configured in various manners depending on the intended use. For example, a configuration in which a holding member is attached to the substrate holding pillar 83 or a configuration in which an annular member for supporting the wafers W is provided in the substrate holding pillar 83 may be employed.

Three substrate holding pillars 83 and two auxiliary pillars 84 are shown in FIGS. 2A and 2B. The number of substrate holding pillars 83 may be three or more, and may be increased to four or five as necessary. For example, in FIG. 2, it is also possible to provide five substrate holding pillars 83 using the two auxiliary pillars 84 as the substrate holding pillars 83. On the other hand, the auxiliary pillars 84 may be provided as necessary, and may be eliminated if unnecessary. Hereinafter, both the substrate holding pillars 83 and the auxiliary pillars 84 may be collectively referred to as pillars 83 and 84 in some cases.

The ceiling plate 81 is provided on the top of the wafer boat 80 and forms a ceiling surface. As shown in FIG. 2A, the ceiling plate 81 has a circular portion 81a and a protruded portion 81b. The circular portion 81a is a portion that forms a circle around a point C1. The protruded portion 81b is a portion that protrudes radially outward from the circular portion 81a. The substrate holding pillars 83 and the auxiliary pillars 84 are installed in the protruded portions 81b, respectively. Therefore, below the ceiling plate 81, the substrate holding pillars 83 and the auxiliary pillars 84 are the outmost portions that protrude outward. The outmost portion defines a revolving radius R of the wafer boat 80.

As shown in FIG. 2A, in the ceiling plate 81, the protruded portion 81b is a portion located on the outermost side of the ceiling plate 81. In the substrate processing apparatus, the substrate processing is performed while rotating the wafer boat 80. Thus, the outermost portion of the protruded portion 81b defines the revolving radius R of the wafer boat 80, as indicated by a broken line. As shown in FIG. 2A, the protrusion amounts of the five protruded portions 81b are set to be equal to each other. Each of the five protruded portions 81b defines the revolving radius R of the wafer boat 80 at the side of the ceiling plate 81.

FIG. 2B is a side sectional view available when seen from an X-X direction in FIG. 2A. As shown in FIG. 2B, the outermost portion of the protruded portion 81b of the ceiling plate 81 and the outermost portion of each of the pillars 83 and 84 are formed to be arranged with each other in outer shape. Therefore, the revolving radius R of the ceiling plate 81 and the revolving radius R of each of the pillars 83 and 84 connected to the ceiling plate 81 are equal to each other. On the other hand, when the pillars 83 and 84 are provided outward of the ceiling plate 81, for example, when the pillars 83 and 84 are provided so as to contact with the outer surfaces of the ceiling plate 81 and the bottom plate 82, the peripheral surfaces of the pillar 83 and 84 are the outermost surface of the wafer boat 80 and thus define the revolving radius R of the wafer boat 80. Conversely, when the ceiling plate 81 and the bottom plate 82 have the same outer diameter and the pillars 83 and 84 are provided inward of the ceiling plate 81, the outer diameter of the ceiling plate 81 is the outermost portion of the wafer boat 80 and thus defines the revolving radius R of the wafer boat 80.

In the present embodiment, the case where the protruded portion 81b of the ceiling plate 81 and the outermost surface of each of the pillars 83 and 84 coincide with each other will be described below. However, the present disclosure may be applied to a wafer boat 80 having a configuration in which the pillars 83 and 84 protrude outward from the ceiling plate 81.

As shown in FIG. 2C, when viewing the bottom plate 82 from the top, taken along line D-D in FIG. 2B, like the ceiling plate 81, circular portions 82a and protruded portions 82b which protrude radially outward from the circular portions 82a are provided in the bottom plate 82. The pillars 83 and 84 are installed in the protruded portions 82b, respectively. As shown in FIG. 2B, a shape of the outermost portion of the protruded portion 82b coincides with that of each of the pillars 83 and 84 connected and fixed to the bottom plate 82. In addition, unlike the ceiling plate 81, an opening 82c is formed in the central region of the bottom plate 82. The opening 82c is provided such that the bottom plate 82 engages with a mounting table through the opening 82c when the wafer boat 80 is placed on a heat insulating barrel 75. The opening is not essential but may be formed as necessary (see FIG. 1).

Returning to FIG. 1, the wafer boat 80 is placed on a table 74 via the heat insulating barrel 75 made of quartz. The table 74 is supported by an upper end portion of a rotary shaft 72 that passes through the lid 60 that opens and closes the lower end opening of the reaction tube 10. For example, a magnetic fluid seal 73 is provided in a portion through which the rotary shaft 72 penetrates. The magnetic fluid seal 73 rotatably supports the rotary shaft 72 while hermetically sealing the rotary shaft 72. Further, a seal member 61 such as an O-ring is provided between the peripheral portion of the lid 60 and the lower end portion of the reaction tube 10 to secure the sealing property with respect to the interior of the reaction tube 10.

The lid 60 is attached to an arm 71 supported by an elevating mechanism 70 such as a boat elevator, so that the wafer boat 80 and the lid 60 are moved upward and downward as a unit. In some embodiments, the table 74 may be fixed to the side of the lid 60 and the wafer W may be processed without rotating the wafer boat 80.

The rotary shaft 72 is attached to the lower surface of the lid 60. A motor 76a is installed in the vicinity of the rotary shaft 72. The rotary shaft 72 and the motor 76a are connected to each other via a pulley and a belt. The rotary shaft 72 is rotated with the rotation of the motor 76a. The motor 76a is provided with an encoder 76b. The encoder 76b is a rotational position detection part configured to detect a rotational position of the rotary shaft 72. The use of the encoder 76b makes it possible to check the positions of the pillars 83 and 84 of the wafer boat 80. The rotational positions of the pillars 83 and 84 detected by the encoder 76b are used to control a timing of rotating an injector 110 to avoid the injector 110 from coming into contact with the pillars 83 and 84, as will be described later.

A manifold 90 is provided at the lower end portion of the reaction tube 10. The manifold 90 has a portion extending along an inner peripheral wall of the reaction tube 10 and a flange-like portion extending outward in the radial direction. A necessary gas is introduced into the reaction tube 10 from the lower end portion of the reaction tube 10 via the manifold 90. The manifold 90 is configured as a separate part from the reaction tube 10. However, the manifold 90 may be provided integrally with the sidewall of the reaction tube 10 to constitute a portion of the sidewall of the reaction tube 10. Details of the configuration of the manifold 90 will be described later.

The manifold 90 supports the injector 110. The injector 110 is a tubular member for supplying a gas into the reaction tube 10 and is made of, for example, quartz. The injector 110 is provided so as to extend in the vertical direction inside the reaction tube 10. The injector 110 has a plurality of gas discharge holes 111 formed at predetermined intervals along a longitudinal direction. The gas is horizontally discharged through the plurality of gas discharge holes 111.

The injector 110 includes a gas supply portion 112 having the gas discharge holes 111, and a gas introduction portion 113 in which the gas discharge holes 111 are formed and through which the gas is introduced. As shown in FIG. 1, the gas discharge holes 111 are located inward of the pillar 83 of the wafer boat 80. This is to efficiently supply the processing gas toward the wafers W at positions closer to the wafers W.

However, in the case where the gas supply portion 112 is provided to protrude inward of the pillar 83, the gas supply portion 112 of the injector 110 may collide with the pillar 83 when the wafer boat 80 is rotated. Therefore, in the substrate processing apparatus according to the present embodiment, the injector 110 is rotated to avoid the gas supply portion 112 of the injector 110 from colliding with the pillar 83.

Only one injector 110 is shown in FIG. 1, but a plurality of injectors 110 may be provided depending on the type, position or the like of a processing gas to be supplied.

Figure 3:
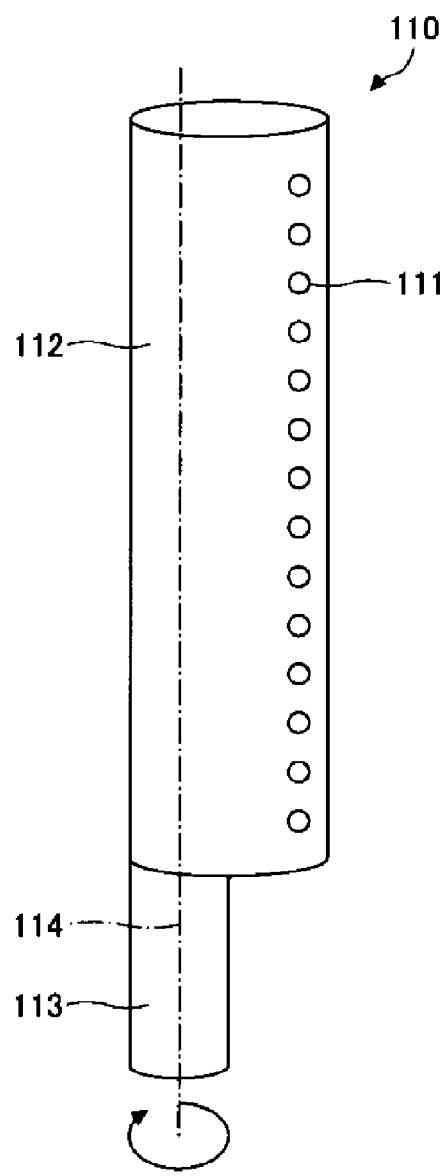
FIG. 3 is a perspective view showing an example of an injector according to an embodiment of the present disclosure.

FIG. 3 is a perspective view showing an example of the injector 110 according to an embodiment of the present disclosure. The injector 110 according to the present embodiment includes the gas supply portion 112 having the gas discharge holes 111 formed therein and the gas introduction portion 113 through which the processing gas is introduced.

The gas supply portion 112 has a sectional shape that protrudes and extends in one direction from the gas introduction portion 113. The gas supply portion 112 may have various shapes as long as horizontal cross-sectional shape thereof is an elongated shape. For example, the gas supply portion 112 may have an elliptical shape having a major axis and a minor axis or a shape such as a rectangle having a long side and a short side. In FIG. 3, an example in which the horizontal cross-sectional shape of the gas supply portion 112 is an ellipse is illustrated. In this embodiment, the horizontal cross-sectional shape of the gas supply portion 112 is an elliptical shape having a major axis and a minor axis. Thus, the gas supply portion 112 has a shape that protrudes in one direction. The gas discharge holes 111 are formed in a leading end of the shape protruding in one direction, namely an end surface intersecting with the major axis of the elliptical shape. Thus, the gas discharge holes 111 may be arranged close to the wafers W in the wafer boat 80. In FIG. 3, the horizontal cross-sectional shape of the gas supply portion 112 is designed to include the gas introduction portion 113. As a result, the gas introduction portion 113 and the gas supply portion 112 can be connected to each other without any obstacle that obstructs a flow of the gas from the gas introduction portion 113. This makes it possible to smoothly implement the flow of gas from the gas introduction portion 113 to the gas supply portion 112. However, it is not essential that the horizontal cross-sectional shape of the gas supply portion 112 is designed to include the gas introduction portion 113. The injector 110 may be designed in various shapes depending on the intended use.

The gas discharge holes 111 are formed in the vertical direction, namely along the longitudinal direction of the injector 110. This is to supply the processing gas to all the wafers W because the wafers W are held in multiple stages inside the wafer boat 80 at predetermined intervals in the vertical direction. Therefore, a height of the gas supply portion 112 may be set to be at least higher than a height at which the wafers are held. In this embodiment, the gas supply portion 112 has substantially the same height as the wafer boat 80. The horizontal cross-sectional shape of the gas supply portion 112 of the injector 110 may be in a linearly symmetrical relationship with respect to the major axis passing through the gas discharge holes 111. This is because such a bilaterally symmetric relationship is easier to handle and the supply of the processing gas tends to be uniform.

An upper end of the gas supply portion 112 is closed, and a lower end thereof is connected to the gas introduction portion 113. By closing the upper end, the processing gas can be supplied from the gas discharge holes 111 in the horizontal direction.

The gas introduction portion 113 is provided below the gas supply portion 112. The gas introduction portion 113 is a gas flow path through which the processing gas is introduced via the manifold 90 and through which the processing gas is supplied to the gas supply portion 112. The gas introduction portion 113 is connected to the lower end of the gas supply portion 112. The gas introduction portion 113 does not need to have a protruded shape. For example, the horizontal cross-sectional shape of the gas introduction portion 113 may be a circular. In the substrate processing apparatus according to the present embodiment, from the viewpoint of allowing the injector 110 to be rotated while processing the substrates, the gas introduction portion 113 may have a shape that can be easily rotated. Therefore, in this embodiment, the gas introduction portion 113 may be configured to have a circular shape, and the center of the circle may coincide with a rotation axis 114.

An outer end surface of the gas introduction portion 113, namely an end surface opposite to the protruded portion of the gas supply portion 112, may be formed continuously with the end surface of the gas supply portion 112. This makes it possible to set the rotation diameter of the gas supply portion 112 to a large level, thus supplying the processing gas toward the wafers W at a location closer to the wafers W.

The formation of the gas introduction portion 113 smaller than the gas supply portion 112 in diameter is not essential in carrying out the substrate processing method according to the present embodiment. For example, the gas introduction portion 113 may be provided to have the same shape as the gas supply portion 112, and the rotation axis 114 may be located near the outer side of the gas introduction portion 113 such that both the gas introduction portion 113 and the gas supply portion 112 which have the elliptical shape are rotated.

However, from the viewpoint of performing efficient rotation, the viewpoint of simplifying the rotation mechanism, and the viewpoint of efficiently establishing the upward flow of the processing gas, the gas introduction portion 113 may be provided smaller than the gas supply portion 112 in diameter and may have a shape that can be easily rotated, like a circle.

The gas introduction portion 113 may have a regular polygonal shape. For example, the gas supply portion 112 may have a rectangular shape and the gas introduction portion 113 may have a square shape. Even when the gas introduction portion 113 is square, the rotation mechanism does not become complicated by providing a square holding part and rotating the holding part about the rotation axis 114 coinciding with the center of the square. Therefore, the gas introduction portion 113 and the gas supply portion 112 may be formed in various shapes depending on the intended use.

The gas discharge holes 111 of the gas supply portion 112 may not be formed in the leading end of the gas supply portion 112. However, from the viewpoint of efficiently supplying the processing gas in a state where the gas discharge holes 111 are located close to the wafers W, the gas discharge holes 111 may be formed in the leading end (vertex) of a shape protruding in one direction.

[Operation of Injector and Substrate Processing Apparatus]

FIGS. 4A to 4D are views for explaining the operations of the injector and the substrate processing apparatus according to an embodiment of the present disclosure.

FIG. 4A is a view showing a state where the leading end of the injector is close to the wafer boat, which is a sectional view when viewed the substrate processing apparatus from the top. Although only the reaction tube 10 is shown in FIG. 1, an example in which an inner tube 12 is provided inside the reaction tube 10 will be described with reference to FIG. 4A.

The wafer boat 80 is provided inside the inner tube 12. The injector 110 is accommodated in an injector accommodation portion 12a that protrudes outward of the inner tube 12 and has a recessed inner peripheral wall. Further, an exhaust port 12b is formed at a position on the opposite side of the inner tube 12 from the injector 110. Description will be given with an example in which the wafer boat 80 has three substrate holding pillars (hereinafter simply referred to as "pillars") 83. Description will be also given with an example in which the wafer boat 80 is rotated clockwise.

As shown in FIG. 4A, the gas discharge holes 111 of the injector 110 are arranged at a position closest to the wafers W placed in the wafer boat 80 toward the center of the wafer boat 80. That is to say, a distance between the rotational center of the injector and the gas discharge hole 111 is set to be larger than a distance between the rotational center of the injector 110 and the revolving radius R of the pillar 83, and smaller than a distance between the rotational center of the injector 110 and the outer edge of the wafer W. The gas discharge holes 111 are arranged at a position close enough not to contact the wafers W. In this state, when the processing gas is supplied from the gas discharge holes 111 formed in the leading end of the injector 110, it becomes easy for the processing gas to reach inward of each wafer W. In other words, when the processing gas is supplied at a position beyond the revolving radius R through which the pillars 83 of the wafer boat 80 pass, the processing gas flows into a space between the reaction tube 10 and the wafers W. This makes it easy to generate a turbulent flow. However, when the processing gas is supplied at the position closest to the wafers W, the amount of the processing gas flowing toward other than the wafers can be reduced. Therefore, it is possible to supply the processing gas toward the wafers W with very high gas supply efficiency.

FIG. 4B is a view showing a state in which the pillar 83 is close to the injector 110. As shown in FIG. 4B, the injector 110 is rotated counterclockwise so as to avoid contact with the support 83. With this operation, it is possible to secure the traveling path of the pillars 83 and prevent the pillars 83 from colliding with the injector 110. The injector 110 is rotated around the rotation axis 114 of the gas introduction portion 113. As shown in FIG. 4B, the major axis of the horizontal cross-section of the gas supply portion 112 is rotated counterclockwise by about 90 degrees. That is to say, the injector 110 is rotated until it becomes substantially parallel to the inner wall of the injector accommodation portion 12a. The rotation angle may be arbitrarily set as long as the injector 110 can reliably avoid contact with the pillars 83.

Here, at least the rotation axis 114 of the gas introduction portion 113 needs to be located beyond the revolving radius R of the wafer boat 80. In addition, as shown in FIGS. 4A to 4D, in the case where a maximum allowable rotation angle of the injector 110 is set to be about 90 degrees, when the injector 110 is rotated at the maximum allowable angle, it is necessary to set the rotation angle to an angle enough to avoid the pillars 83 from being brought into contact with the gas supply portion 112 of the injector 110.

FIG. 4C is a view showing a state in which the pillar 83 has passed through the injector 110. In this way, the injector 110 rotates and waits in the injector accommodation portion 12a until the pillar 83 approaches the injector 110 and subsequently passes through the injector 110. This makes it possible to avoid the injector 110 from being brought into contact with the pillar 83 even when the wafer boat 80 is rotated.

FIG. 4D is a view showing a state in which the injector 110 is rotated after the respective pillar 83 has passed through the injector 110. As shown in FIG. 4D, after the respective pillar 83 has passed through the injector 110, the injector 110 can be rotated again and be positioned at the position close to the wafers W. This makes it possible to supply the processing gas toward the wafers W in an efficient manner. At this time, the injector 110 is rotated in a direction opposite to that in the waiting state in FIG. 4B, namely clockwise.

As described above, the injector 110 is rotated only when the pillar 83 approaches the injector 110 to avoid contact of the injector 110 with the pillar 83. In other cases, the injector 110 can supply the processing gas toward the wafers W in the state in which the injector 110 is located close to the wafers W inward of the outer diameter of the pillar 83, thus performing the substrate processing in an efficient manner.

This operation may be implemented by detecting the position of the pillar 83 of the wafer boat 80 by means of the encoder 76b incorporated in the motor 76a shown in FIG. 1, and rotating the injector 110 based on a position information thus detected.

The above operation may be implemented by controlling, with a controller 140 shown in FIG. 1, the operation of the rotation mechanism configured to rotate the injector 110 based on the position information detected by the encoder 76b. The controller 140 controls the overall operation of the substrate processing apparatus. The controller 140 may include a CPU (Central Processing Unit), a ROM (Read Only Memory) and a RAM (Random Access Memory), and may be realized by a microcomputer that reads and executes a program, an ASIC (Application Specific Integrated Circuit) composed of an IC (Integrated Circuit) developed for a specific purpose, and the like.

Instead of the encoder 76b, an optical sensor or a camera may be used to detect the position of the pillar 83. The rotation control of the injector 110 may be performed based on the detected position of the pillar 83.

In a case where the number of pillars 83 is increased, the rotation of the injector 110 may be controlled to avoid the contact of the injector 110 with each of the pillars 83. That is to say, as described with reference to FIGS. 2A to 2C, in the case where the auxiliary pillars 84 that protrude outward are provided, it is necessary to rotate the injector 110 so as not to come into contact with these pillars 84. On the other hand, when the outwardly protruded portion is located at such an extent so as not to collide with the injector 110, there is no need to rotate the injector 110. Further, in the case where the pillars 83 and 84 are attached to the inside of the ceiling plate 81 and the bottom plate 82 of the wafer boat 80, and where the outer diameters of the ceiling plate 81 and the bottom plate 82 coincide with the revolving radius R, the height of the gas supply portion 112 may be set to fall between the ceiling plate 81 and the bottom plate 82 to avoid the contact of the injector 110 with the pillars 83 and 84.

As described above, it is possible to determine whether to rotate the injector 110 based on whether or not the collision of the injector 110 with the pillar 83 occurs.

[Injector Rotation Mechanism]

Next, an example of an injector rotation mechanism for rotating the injector 110 will be described. The mechanism for rotating the injector 110 is optional as long as it can rotate the injector 110 at an appropriate angle at an appropriate timing. Here, an example of the injector rotation mechanism will be described, but the present disclosure is not limited thereto.

Figure 5A:
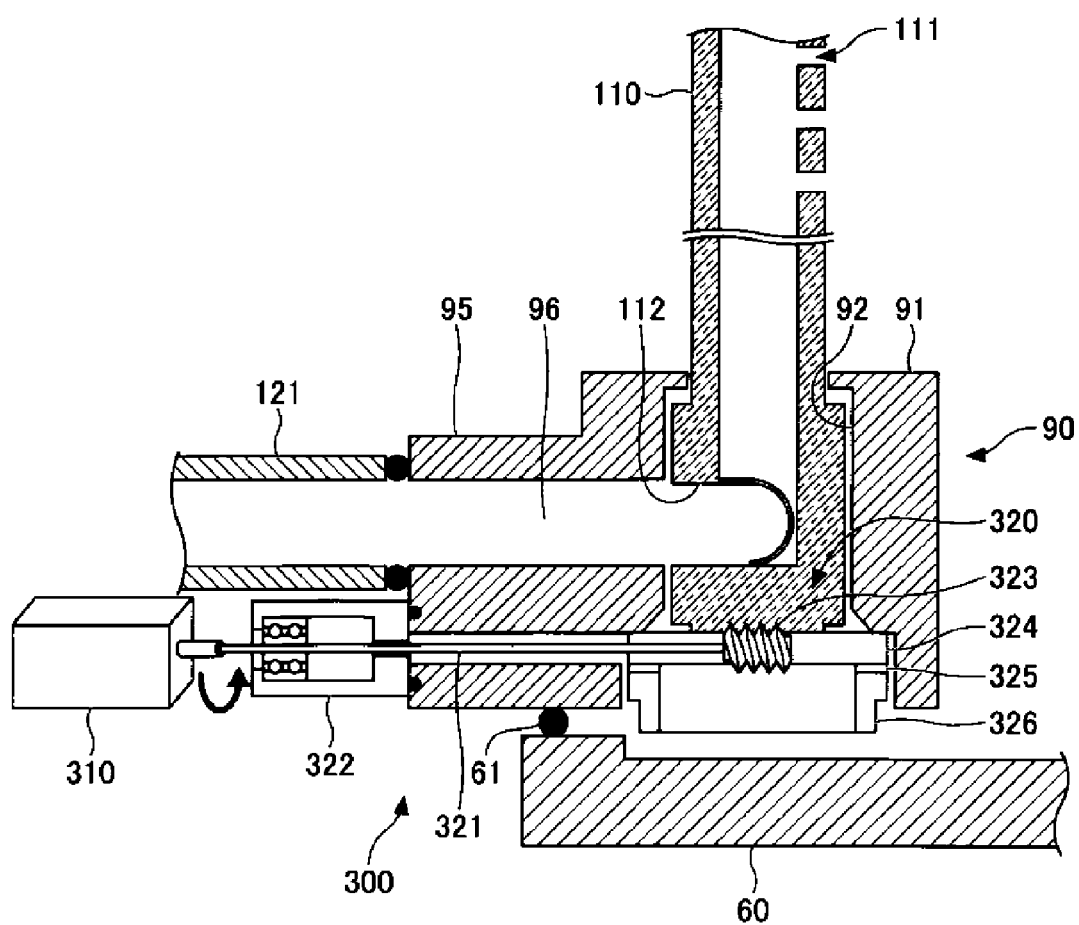
FIGS. 5A and 5B are views showing an example of an injector rotation mechanism which is applicable to the substrate processing apparatus and a substrate processing method according to the embodiment.
Figure 5B:
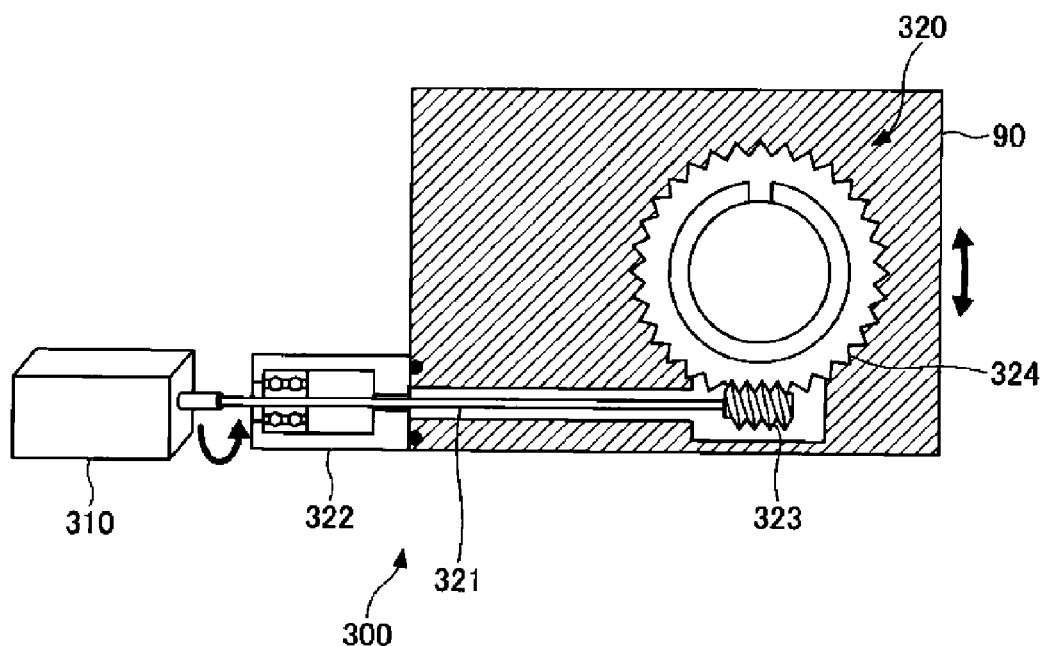

FIGS. 5A and 5B are views showing an example of an injector rotation mechanism which is applicable to the substrate processing apparatus and the substrate processing method according to the present embodiment. As shown in FIGS. 5A and 5B, a gas introduction mechanism includes a manifold 90, an injector 110, a rotation mechanism 300 and a gas pipe 121.

The manifold 90 includes an injector supporting part 91 and a gas inlet 95.

The injector supporting part 91 extends in the vertical direction along the inner wall surface of the reaction tube 10 to support the injector 110. The injector supporting part 91 has an insertion hole 92 into which the lower end of the injector 110 can be inserted. The lower end of the injector 110 can be externally fitted into the insertion hole 92 and supported by the injector supporting part 91.

The gas inlet 95 is a portion that protrudes radially outward of the injector supporting part 91 and is exposed outward of the reaction tube 10. The gas inlet 95 has a gas flow path 96 through which the insertion hole 92 is in communication with to the outside of the reaction tube 10 and through which the gas passes. A gas pipe 121 is connected to an outer end portion of the gas flow path 96 so that an external gas can be supplied through the gas pipe 121.

The injector 110 is inserted into the insertion hole 92 of the injector supporting part 91 and linearly extends along the inner wall surface of the reaction tube 10 as a whole. The injector 110 has an opening 112 communicating to the gas flow path 96 at a location at the injector 110 is inserted into the insertion hole 92. The opening 112 may be formed in a substantially elliptical shape having a horizontal axis as a major axis and a vertical direction as a minor axis. With this configuration, even when the injector 110 is rotated, the gas is efficiently supplied from the gas flow path 96 into the injector 110.

The manifold 90 may be made of metal. From the viewpoint of preventing metal contamination, the reaction tube 10 and parts constituting the reaction tube 10 may be essentially made of quartz. Further, locations having complicated shapes or locations at which connection is made with screws or the like need to be made of metal. The manifold 90 of the processing apparatus according to the embodiment of the present disclosure is also made of metal. The injector 110 is formed in not L-like shape but a bar shape. The horizontally extending gas flow path 96 is formed inside the gas inlet 95 of the manifold 90. The opening 112 communicating to the gas flow path 96 is formed in the injector 110. Such a configuration eliminates a thick horizontal portion in the injector 110. This eliminates a need for the gas inlet 95 of the manifold 90 to accommodate the thick horizontal portion in the injector 110, thus reducing the thickness of the gas inlet 95 of the manifold 90 and lowering the height of the gas inlet 95. It is therefore possible to reduce metal contamination. An example of the metal constituting the manifold 90 may include a corrosion-resistant metal material such as stainless steel, aluminum, hastelloy or the like.

The gas introduction mechanism shown in FIG. 5 rotates the injector 110 using the rotation mechanism 300 having a motor 310 and a worm gear mechanism 320.

As shown in FIG. 5, the rotation mechanism 300 is connected to the lower end portion of the injector 110 and rotates the injector 110 with its longitudinal direction as the central axis. Specifically, the rotation mechanism 300 including the motor 310 and the worm gear mechanism 320 transforms a rotational motion generated by the motor 310 into a rotational force in a rotational direction at a certain rotation speed by the worm gear mechanism 320 and delivers them to the injector 110.

The motor 310 may be a direct current (DC) motor.

The worm gear mechanism 320 includes a rotary shaft 321, a magnetic fluid seal 322, a worm 323, a worm wheel 324, a washer 325 and a holding bolt 326.

The rotary shaft 321 has a rod shape and is inserted into the manifold 90 in a state in which airtightness is maintained by the magnetic fluid seal 322. One end of the rotary shaft 321 is connected to the motor 310. Thus, the rotary shaft 321 is rotated with the operation of the motor 310. A bellows may be used in place of the magnetic fluid seal 322.

The worm 323 is fixed to a leading end of the rotary shaft 321. Thus, when the rotary shaft 321 is rotated, the worm 323 is rotated together with the rotary shaft 321.

The worm wheel 324 is screwed with the worm 323 and can be rotated forward and backward. Thus, when the worm 323 is rotated, the worm wheel 324 is rotated counterclockwise or clockwise (in a direction indicated by an arrow in FIG. 5B) with the rotational direction of the worm 323. The worm wheel 324 holds the injector 110 so that the injector 110 is not rotated in the circumferential direction with respect to the worm wheel 324. As a result, when the worm wheel 324 is rotated, the injector 110 is rotated together with the worm wheel 324. The worm wheel 324 is rotatably held by the holding bolt 326 via the washer 325.

For example, by providing the rotation mechanism configured as above, it is possible to rotate the injector 110 and supply the processing gas toward the wafers W at the position close to the wafers W while preventing the gas supply portion 112 of the injector 110 from being brought into contact with the pillars 83 and 84 of the wafer boat 80.

The rotation mechanism 300 described in the present embodiment is merely an example, but may be any rotation mechanism such as a rotation mechanism using a rack-and-pinion depending on the intended use.

[Substrate Processing Method]

Next, the operation when a vertical heat treatment apparatus shown in FIG. 1 performs a film forming process will be described. When the vertical heat treatment apparatus performs the film forming process, the wafer boat 80 in which a plurality of wafers W, for example, about 50 to 100 wafers W, are accommodated, is mounted on the table 74 above the lid 60. The lid 60 is moved upward to seal the reaction tube 10 so that the wafers W are placed in the reaction tube 10. Although only one injector 110 is shown in FIG. 1, an example in which a plurality of injectors 110 (not shown) is provided will be described.

Subsequently, the vacuum pump 34 is operated to evacuate the interior of the reaction tube 10 so that an internal pressure of the reaction tube 10 reaches a predetermined degree of vacuum.

Subsequently, the wafer boat 80 is rotated and a processing gas is supplied from the plurality of injectors 110. The processing gas may be optional depending on the intended use. For example, in a case of forming a silicon oxide film, a silicon-containing gas and an oxidizing gas may be supplied. An example of the silicon-containing gas may include an aminosilane gas, and an example of the oxidizing gas may include an ozone gas. When the aminosilane gas reacts with the ozone gas, a silicon oxide is deposited on the wafer W as a reaction product, thereby forming the silicon oxide film.

A timing at which the processing gas is initially supplied may be in the state shown in FIG. 4A. That is to say, it is preferable that the supply of the processing gas is started at a position where the protruded leading end of the injector 110 is oriented to the center of the wafer boat 80 and the gas discharge holes 111 are closest to the outer periphery of each wafer W in a state where the injector 110 is not being rotated. However, this is not essential, but the supply of the processing gas may be started from the state where the injector 110 is rotated as shown in FIGS. 4B and 4C.

In a case of CVD (Chemical vapor deposition)-based film formation, the aminosilane gas and the ozone gas are simultaneously supplied into the reaction tube 10. On the other hand, in a case of ALD (Atomic Layer Deposition)-based film formation, the aminosilane gas alone is initially supplied into the reaction tube 10 to be adsorbed onto the front surface of each wafer W. Thereafter, the interior of the reaction tube 10 is purged with a purge gas. Subsequently, the ozone gas is supplied to cause the ozone gas to react with the aminosilane gas adsorbed onto the front surface of each wafer W. Thus, a silicon oxide film layer is formed on the front surface of each wafer W. Thereafter, the purge gas is supplied into the reaction tube 10. A cycle that includes supplying the aminosilane gas, supplying the purge gas, supplying the ozone gas and supplying the purge gas is repeated to gradually deposit the silicon oxide film layer on the front surface of each wafer W.

At that time, the positions of the pillars 83 and 84 of the wafer boat 80 are detected by the encoder 76b. When the pillars 83 and 84 reach a predetermined distance or a predetermined angle with respect to the injector 110, the rotation operation of the injector 110 is started. The rotation operation may be performed using the mechanism described in the above embodiment. As described with reference to FIG. 4, when the wafer boat 80 is rotated clockwise, the rotational direction of the injector 110 may be counterclockwise, and when the wafer boat 80 is rotated counterclockwise, the rotational direction of the injector 110 may be clockwise. Since the wafer boat 80 and the injector 110 are face each other, when the wafer boat 80 and the injector 110 are rotated in the opposite directions, they coincide with each other in movement direction. Thus, it is possible to avoid the injector 110 from coming into contact with the wafer boat 80 in a smooth manner without countering the movement direction of the wafer boat 80.

The encoder 76b is merely an example of a means for detecting the positions of the pillars 83 and 84, but other detection means such as an optical detector and detection methods such as an imaging method may be used.

The timing and rotation speed at which the injector 110 starts to be rotated may be set to appropriate values in consideration of the rotation speed of the wafer boat 80 and the like. Similarly, the timing and rotation speed at which the injector 110 returns to the original state after being rotated may be set to appropriate values. It is preferable to increase a time for which the injector 110 can supply the processing gas near the outer periphery of the wafers W as long as possible while reliably avoiding the contact of the injector 110 with the wafer boat 80.

The series of operations as described above may be performed by the controller 140. That is to say, the detection signal of the encoder 76b is transmitted to the controller 140, and the controller 140 instructs the rotation mechanism 300 to rotate the injector 110 at an appropriate timing and rotation speed. Accordingly, it is possible to reliably avoid the injector 110 from coming into contact with the wafer boat pillars 83 and 84 and to rotate the injector 110 in a timely manner.

In this way, the silicon oxide film can be formed on the front surface of each wafer W. The processing gas used at that time is supplied from a processing gas supply source 123 to the injector 110 via the gas pipe 121. Further, since the injector 110 can supply the processing gas at a position close to the wafers W, namely at a position inward of the pillars 83 and 84, the substrate processing can be performed in an efficient manner.

Conventionally, the position of the pillars 83 and 84 is regarded as the revolving radius R of the wafer boat 80, and the injector 110 is arranged at a position away from the revolving radius R. However, in the present embodiment, the processing gas can be supplied at a position close to the outer periphery of each wafer W inward of the pillars 83 and 84, thereby improving the adsorption efficiency of a raw material gas and the reaction efficiency of a reaction gas.

The inner tube 12 is not shown in FIG. 1. In the case where the inner tube 12 is provided, the injector 110 is disposed in the inner tube 12 as described with reference to FIGS. 4A to 4D to supply the processing gas into the inner tube 12.

The substrate processing described above is continued until a thin film has a predetermined film thickness. When the thin film has the predetermined film thickness, the supply of the processing gas is ceased and the rotation of the wafer boat 80 is stopped. Then, the lid 60 is moved downward to unload the wafers W subjected to the substrate processing from the wafer boat 80. Since the substrate processing implemented in the present embodiment is a film forming process, the wafers W having the thin film formed on their front surfaces are unloaded.

By using the injector 110 having a portion protruding in one direction, it is possible to perform the film forming process with high gas supply efficiency, thereby improving throughput and film quality.

As described above, according to the injector, the substrate processing apparatus and the substrate processing method according to the present embodiment, it is possible to supply the processing gas at a position closer to the wafers W while preventing the injector 110 and the pillars 83 and 84 of the wafer boat 80 from coming into contact with each other, thereby improving throughput and film quality.

According to the present disclosure in some embodiments, it is possible to supply a processing gas toward a substrate at a position inward of a pillar of a substrate holder without causing an injector to collide with the pillar.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a processing container having a substantially cylindrical shape;
a substrate holder comprising at least one pillar arranged at a position along outer peripheries of a plurality of substrates, the at least one pillar having a holding structure provided inward of the at least one pillar to hold the plurality of substrates at intervals in multiple stages in a vertical direction, the substrate holder configured to be loaded into and unloaded from the processing container;
a substrate holder rotation mechanism configured to rotate the substrate holder;
an injector provided to extend along the substrate holder in the vertical direction and having a portion protruding in one direction in a horizontal cross section, the injector having a plurality of discharge holes formed in a leading end of the protruded portion;
an injector rotation mechanism including a rotary shaft provided at a position outward of the at least one pillar in the injector; and
a controller configured to control the injector rotation mechanism to:
rotate the injector around the rotary shaft so that the injector does not come into contact with the at least one pillar when the at least one pillar approaches the injector by rotating the substrate holder, and
rotate the injector around the rotary shaft so that the plurality of discharge holes are headed toward the plurality of substrates and are located between a revolving radius of an outer edge of the at least one pillar and outer edges of the plurality of substrates when the at least one pillar moves away from the injector,
wherein, when seen in the vertical direction, a plurality of distances in the horizontal cross section between a rotational center of the injector and the plurality of the discharge holes is larger than a distance between the rotational center of the injector and the revolving radius of the outer edge of the at least one pillar, and smaller than a distance between the rotational center of the injector and the outer edges of the plurality of substrates.

2. The substrate processing apparatus of claim 1, wherein the plurality of discharge holes are arranged along the vertical direction.

3. The substrate processing apparatus of claim 1, wherein the controller is configured to control the injector rotation mechanism to rotate the injector so that the plurality of discharge holes are positioned closest to the plurality of substrates when the at least one pillar moves away from the injector.

4. The substrate processing apparatus of claim 1, further comprising: a gas introduction part provided in a lower portion of the injector, wherein the gas introduction part has a center being in a coaxial relationship with the rotary shaft and does not have the protruded portion and the plurality of discharge holes, and wherein a portion of the gas introduction part opposite to the protruded portion forms a common end surface.

5. The substrate processing apparatus of claim 4, wherein the horizontal cross section of the injector has an elliptical shape, and a horizontal cross section of the gas introduction part has a circular shape.

6. The substrate processing apparatus of claim 5, wherein an innermost portion of the gas introduction part is disposed outward of the at least one pillar.

7. The substrate processing apparatus of claim 1, further comprising:

a detector configured to detect a position of the at least one pillar, wherein the controller is connected to the detector and the injector rotation mechanism, and is configured to control the injector rotation mechanism while the substrate holder rotates, based on the position of the at least one pillar that is detected by the detector.

* * * * *